ns777B2

United States Patent
Kim et al.

(10) Patent No.: US 9,928,777 B2
(45) Date of Patent: Mar. 27, 2018

(54) ORGANIC LIGHT EMITTING DISPLAY DEVICE

(71) Applicant: Samsung Display Co., Ltd., Yongin-si (KR)

(72) Inventors: Seong-Min Kim, Yongin-si (KR); Jin-Koo Chung, Suwon-si (KR); Jin-Hyun Park, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/628,576

(22) Filed: Jun. 20, 2017

(65) Prior Publication Data

US 2018/0005574 A1 Jan. 4, 2018

(30) Foreign Application Priority Data

Jul. 1, 2016 (KR) .................. 10-2016-0083709

(51) Int. Cl.
*H01L 51/52* (2006.01)
*G09G 3/3233* (2016.01)
*H01L 27/32* (2006.01)

(52) U.S. Cl.
CPC .......... *G09G 3/3233* (2013.01); *H01L 27/32* (2013.01); *H01L 51/5203* (2013.01); *H01L 51/5296* (2013.01); *G09G 2320/0233* (2013.01); *G09G 2320/0626* (2013.01); *H01L 51/5234* (2013.01)

(58) Field of Classification Search
None
See application file for complete search history.

(56) References Cited

U.S. PATENT DOCUMENTS

2013/0161656 A1   6/2013   Choi et al.
2013/0187131 A1   7/2013   Chung et al.

FOREIGN PATENT DOCUMENTS

KR       10-1275810       6/2013
KR       10-2013-0073721  7/2013

*Primary Examiner* — Cheung Lee
(74) *Attorney, Agent, or Firm* — H.C. Park & Associates, PLC

(57) ABSTRACT

An OLED device including a first emission region, a second emission region, and a transmission region, a pixel circuit disposed on a substrate, a first pixel electrode reflecting light disposed in the first emission region, a second pixel electrode transmitting light disposed in the second emission region, a light emitting layer disposed on the first and second pixel electrodes, a common electrode transmitting light disposed on the light emitting layer and including first, second, and third common electrodes respectively overlapping the first emission region, the second emission region, and the transmission region, and a capping layer disposed on the common electrode and including first, second, and third capping layers respectively overlapping the first emission region, the second emission region, and the transmission region, in which at least two of the first capping layer, the second capping layer, and the third capping layer have different thicknesses from each other.

20 Claims, 14 Drawing Sheets

ORGANIC LIGHT EMITTING DISPLAY DEVICE

CROSS-REFERENCE TO RELATED APPLICATION

This application claims priority from and the benefit of Korean Patent Application No. 10-2016-0083709, filed on Jul. 1, 2016, which is hereby incorporated by reference for all purposes as if fully set forth herein.

BACKGROUND

Field

Exemplary embodiments relate to display devices. More particularly, exemplary embodiments relate to transparent organic light emitting display (OLED) devices and methods of manufacturing the OLED devices.

Discussion of the Background

Recently, a display device (e.g., an organic light-emitting display (OLED) device) having transparent or transmitting properties has been developed. In comparison with a liquid crystal display (LCD) device, the OLED device may emit light in dual (a top and a bottom) directions.

In manufacturing a transparent display device, optimizing various variables (e.g., a composition, a disposition, a thickness, etc.) of components (e.g., substrates, electrodes, insulation layers, etc.) of the transparent display device may be required. For example, the OLED device may include a stack of insulation layers that contain different materials, which may deteriorate optical characteristics (e.g., transmittance) of the OLED device.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments provide an organic light emitting display (OLED) device capable of a top emission and a dual emission, and having an improved light transmittance in a transmission region.

Additional aspects will be set forth in the detailed description which follows, and, in part, will be apparent from the disclosure, or may be learned by practice of the inventive concept.

According to an exemplary embodiment, an OLED device includes a substrate including a first emission region, a second emission region, and a transmission region, a pixel circuit disposed on the substrate, a first pixel electrode disposed in the first emission region, the first pixel electrode configured to reflect light and electrically connected to the pixel circuit, a second pixel electrode disposed in the second emission region, the second pixel electrode configured to transmit light and electrically connected to the pixel circuit, a light emitting layer disposed on the first pixel electrode and the second pixel electrode, the light emitting layer including a first light emitting layer overlapping the first emission region and a second light emitting layer overlapping the second emission region, a common electrode disposed on the light emitting layer, the common electrode configured to transmit light and including a first common electrode overlapping the first emission region, a second common electrode overlapping the second emission region, and a third common electrode overlapping the transmission region, and a capping layer disposed on the common electrode, the capping layer including a first capping layer overlapping the first emission region, a second capping layer overlapping the second emission region, and a third capping layer overlapping the transmission region, in which at least two of the first capping layer, the second capping layer, and the third capping layer have different thicknesses from each other.

A thickness of the second capping layer may be substantially the same as a thickness of the third capping layer, and the thickness of the second capping layer may be different from a thickness of the first capping layer.

The thickness of the second capping layer may be less than the thickness of the first capping layer.

A thickness of the second capping layer may be substantially the same as a thickness of the first capping layer, and the thickness of the second capping layer may be different from a thickness of the third capping layer.

The thickness of the second capping layer may be greater than the thickness of the third capping layer.

The thicknesses of the first capping layer, the second capping layer, and the third capping layer may be different from each other.

At least two of the first common electrode, the second common electrode, and the third common electrode may have different thicknesses from each other.

A thickness of the third common electrode may be substantially the same as a thickness of the second common electrode, and the thickness of the third common electrode may be different from a thickness of the first common electrode.

The thickness of the third common electrode may be greater than the thickness of the first common electrode.

A thickness of the third common electrode may be substantially the same as a thickness of the first common electrode, and the thickness of the third common electrode may be different from a thickness of the second common electrode.

The thickness of the third common electrode may be less than the thickness of the second common electrode.

The thicknesses of the first common electrode, the second common electrode, and the third common electrode may be different from each other.

The first common electrode, the second common electrode, and the third common electrode may be electrically connected to each other.

The pixel circuit may overlap the first emission region, and may not overlap the second emission region.

According to an exemplary embodiment, an OLED device includes a substrate including a first emission region, a second emission region, and a transmission region, a pixel circuit disposed on the substrate, a first pixel electrode disposed in the first emission region, the first pixel electrode configured to reflect light and electrically connected to the pixel circuit, a second pixel electrode disposed in the second emission region, the second pixel electrode configured to transmit light and electrically connected to the pixel circuit, a light emitting layer disposed on the first pixel electrode and the second pixel electrode, the light emitting layer including a first light emitting layer overlapping the first emission region and a second light emitting layer overlapping the second emission region, a common electrode disposed on the light emitting layer, the common electrode configured to transmit light and including a first common electrode overlapping the first emission region, a second common electrode overlapping the second emission region, and a third common electrode overlapping the transmission region, and a capping layer disposed on the common electrode, the capping layer including a first capping layer overlapping the first emission region, a second capping layer overlapping the second emission region, and a third capping layer overlapping the transmission region, in which at least two of the first common electrode, the second common electrode, and the third common electrode have different thicknesses from each other.

A thickness of the third common electrode may be substantially the same as a thickness of the second common electrode, and the thickness of the third common electrode may be different from a thickness of the first common electrode.

The thickness of the third common electrode may be greater than the thickness of the first common electrode.

A thickness of the third common electrode may be substantially the same as a thickness of the first common electrode, and the thickness of the third common electrode may be different from a thickness of the second common electrode.

The thickness of the third common electrode may be less than the thickness of the second common electrode.

The thicknesses of the first common electrode, the second common electrode, and the third common electrode may be different from each other.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

Figure 1:
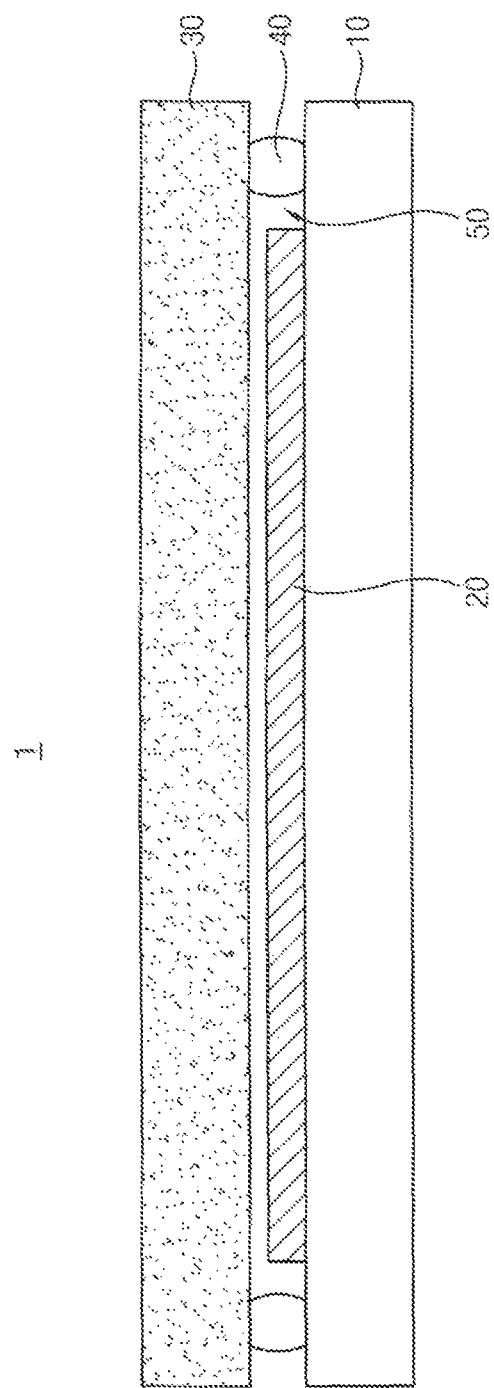
FIG. 1 is a cross-sectional view illustrating an OLED device according to an exemplary embodiment.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. The regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Hereinafter, organic light emitting display (OLED) devices and methods of manufacturing the OLED devices in accordance with exemplary embodiments of the present invention will be explained in detail with reference to the accompanying drawings.

Figure 2:
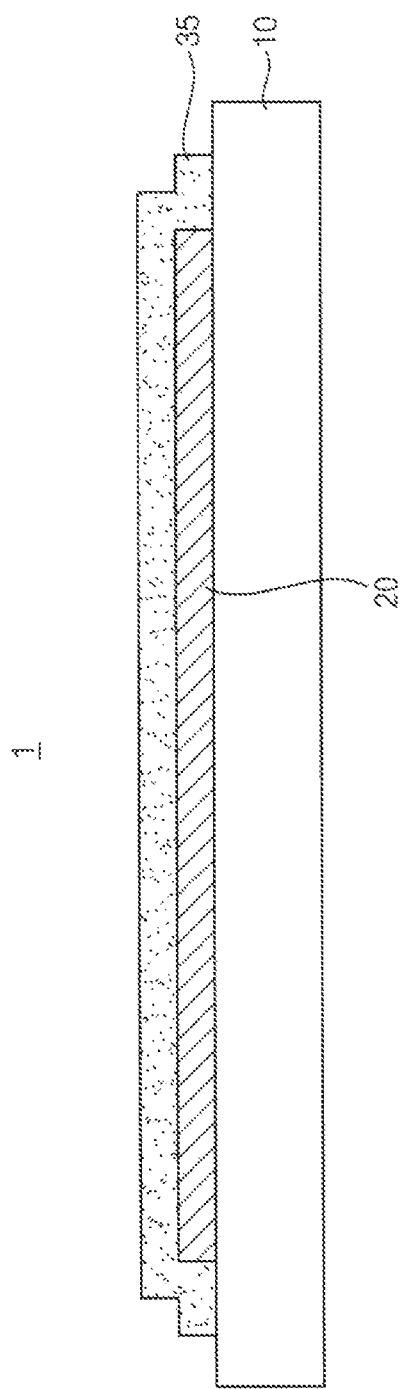
FIG. 2 is a cross-sectional view illustrating an OLED device according to an exemplary embodiment.

FIG. 1 is a cross-sectional view illustrating an OLED device according to an exemplary embodiment. FIG. 2 is a cross-sectional view illustrating an OLED device according to an exemplary embodiment.

Referring to FIG. 1, an OLED device 1 according to an exemplary embodiment may include a substrate 10, an organic light emitting portion 20 disposed on the substrate 10, and an encapsulation substrate 30 encapsulating the organic light emitting portion 20.

The encapsulation substrate 30 may include a transparent material and transmit visible light emitted from the organic light emitting portion 20. The encapsulation substrate 30 may block moisture and/or oxygen from infiltrating into the organic light emitting portion 20.

The substrate 10 and the encapsulation substrate 30 may be coupled to each other by a sealing member 40. The sealing member 40 may seal a space 50 between the substrate 10 and the encapsulation substrate 30. In this case, a moisture absorbent, a filler, or the like may be disposed in the space 50.

Referring to FIG. 2, an encapsulation film 35 may be formed on the organic light emitting portion 20, instead of the encapsulation substrate 30, to protect the organic light emitting portion 20 from moisture and/or oxygen. The encapsulation film 35 may include at least one inorganic layer including an inorganic material, such as silicon oxide or silicon nitride, and at least one organic layer including an organic material, such as epoxy or polyimide, without being limited thereto. For example, any encapsulation structure having thin thickness and transparency may be applied to the display device 1.

Figure 3:
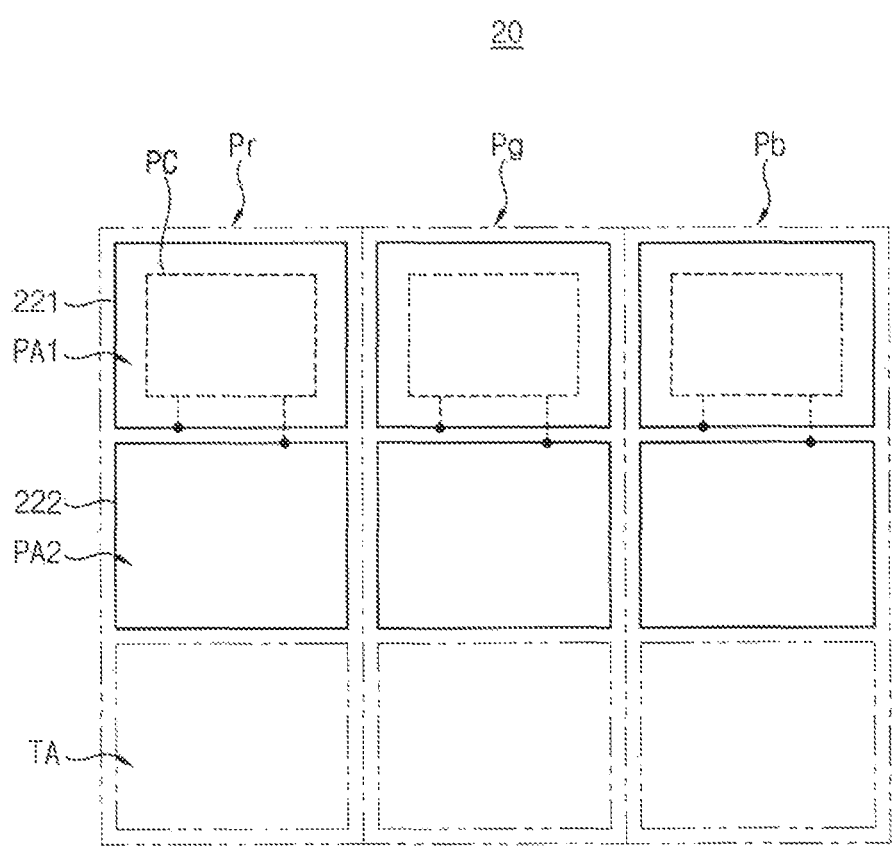
FIG. 3 is a plan view illustrating an organic light emitting portion of FIG. 1 according to an exemplary embodiment.

FIG. 3 is a plan view illustrating an organic light emitting portion of FIG. 1 according to an exemplary embodiment.

Referring to FIG. 3, the organic light emitting portion 20 may include a red pixel Pr, a green pixel Pg, and a blue pixel Pb, which are adjacent to each other. Each of the red pixel Pr, the green pixel Pg, and the blue pixel Pb may include a first emission region PA1, a second emission region PA2, and a transmission region TA.

In FIG. 3, the first emission region PA1, the second emission region PA2, and the transmission region TA in each of the pixels Pr, Pg, and Pb are illustrated as being arranged along a substantially vertical direction. However, the order of arrangement of the regions may be varied. For example, the transmission region TA may be disposed on the top or in the middle portion.

A pixel circuit PC may be disposed in each first emission region PA1. Although not shown in FIG. 3, lines that are connected to the pixel circuit PC may be disposed to penetrate the first emission region PA1 or to be adjacent to the first emission region PA1.

In an exemplary embodiment, the pixel circuit PC may overlap the first emission region PA1 and not overlap the second emission region PA2. The first emission region PA1 may be a top emission region as will be described in detail below. Because the pixel circuit PC that may reduce light transmittance is disposed in a top emission region and not in the transmission region TA, light transmittance in the transmission region TA may be improved. More particularly, the pixel circuit PC may overlap a first pixel electrode 221 and be covered by the first pixel electrode 221, and may not overlap a second pixel electrode 222.

The second emission region PA2 may be a dual emission (including a top emission and a bottom emission) region, as will be described in detail below. Because the pixel circuit PC is not disposed in a dual emission region, a light emitting efficiency of the bottom emission may not be reduced.

Figure 4:
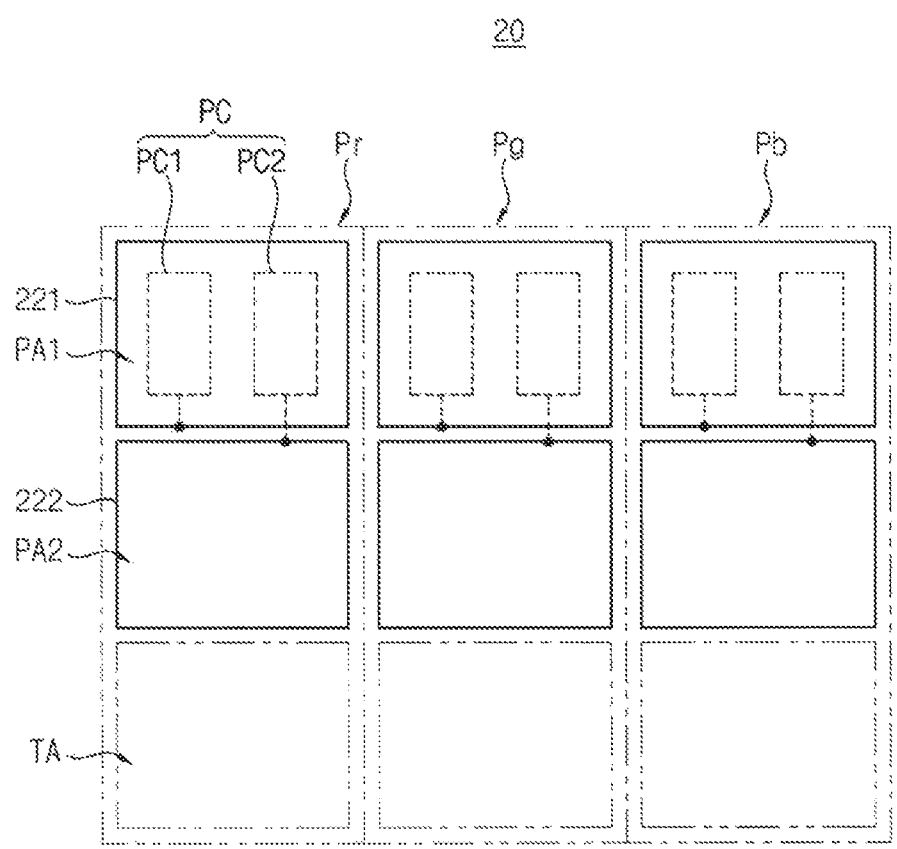
FIG. 4 is a plan view illustrating an organic light emitting portion of FIG. 1 according to an exemplary embodiment.

FIG. 4 is a plan view illustrating an organic light emitting portion of FIG. 1 according to an exemplary embodiment.

Referring to FIG. 4, the pixel circuit PC may include a first pixel circuit PC1 electrically connected to the first pixel electrode 221 and a second pixel circuit PC2 electrically connected to the second pixel electrode 222. The first pixel circuit PC1 and the second pixel circuit PC2 may operate independently from each other. In this case, the first pixel circuit PC1 and the second pixel circuit PC2 may accommodate a composition of a general pixel circuit.

Figure 5:
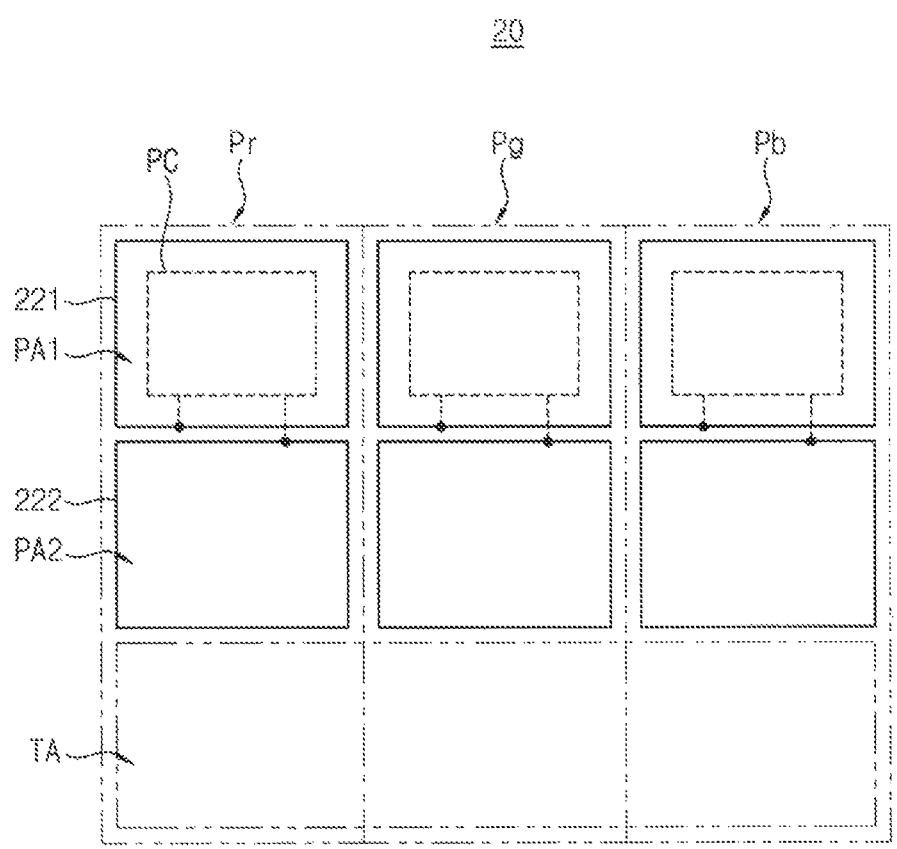
FIG. 5 is a plan view illustrating an organic light emitting portion of FIG. 1 according to an exemplary embodiment.

FIG. 5 is a plan view illustrating an organic light emitting portion in FIG. 1 according to an exemplary embodiment.

Referring to FIG. 5, the transmission region TA of each of the pixels Pr, Pg, and Pb may be shared and extend along the adjacent second emission region PA2. As illustrated in FIGS. 3 and 4, the transmission region TA may be independently formed in each of the red pixel Pr, the green pixel Pg, and the blue pixel Pb. However, as illustrated in FIG. 5, the red pixel Pr, the green pixel Pg, and the blue pixel Pb may share the transmission region TA. In this case, light transmittance may increase since the area of the transmission region TA is expanded.

Figure 6:
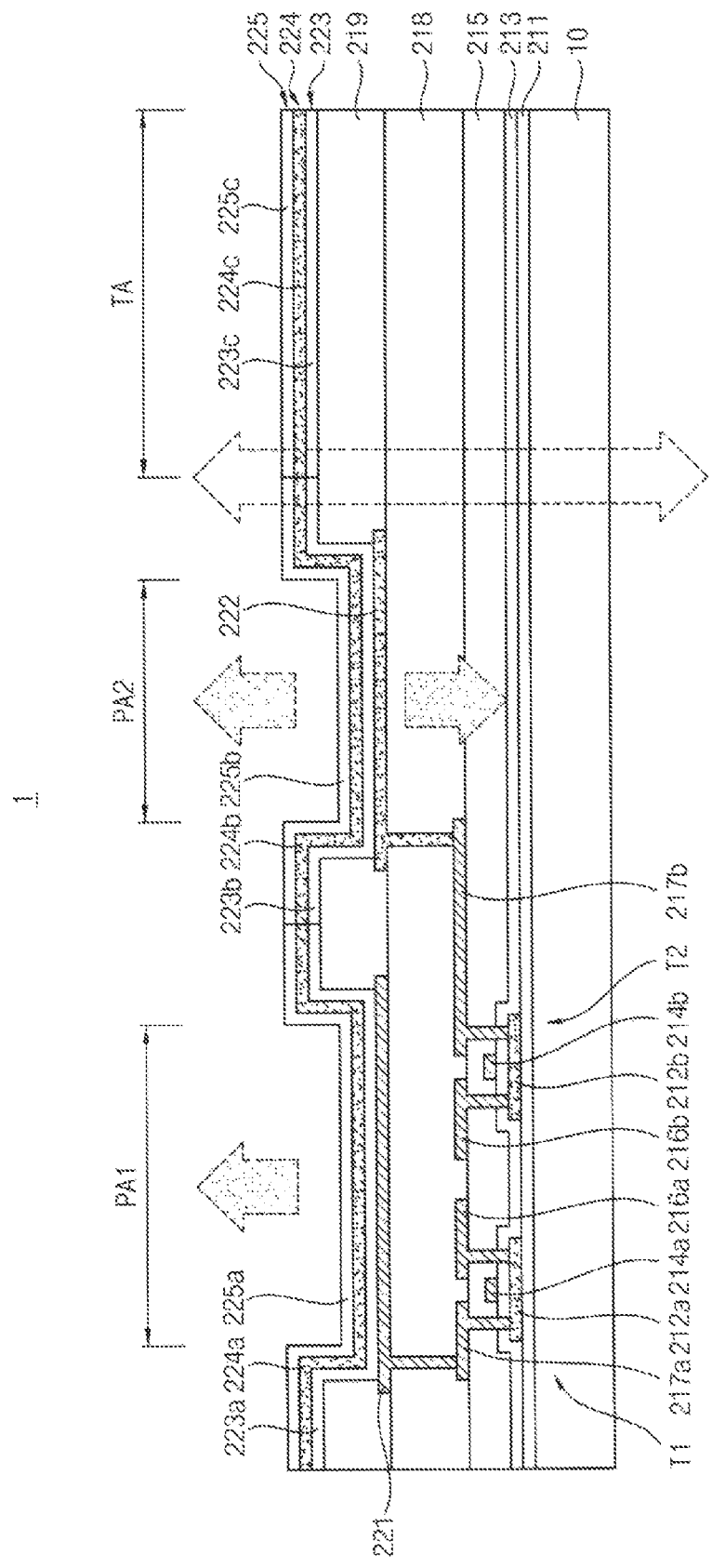
FIG. 6 is a cross-sectional view illustrating one pixel of FIG. 3.

FIG. 6 is a cross-sectional view illustrating one pixel of FIG. 3.

Referring to FIG. 6, a buffer layer 211 may be disposed on the substrate 10, and a first transistor T1 and a second transistor T2 may be disposed on the buffer layer 211. FIG. 6 illustrates only the first transistor T1 and the second transistor T2. However, the present invention is not limited thereto. For example, a plurality of transistors including the first transistor T1 and the second transistor T2 may be disposed on the buffer layer 211.

The buffer layer 211 may block the penetration of impurities, and may planarize a surface of the substrate 10. In an exemplary embodiment, the buffer layer 211 may be omitted.

A first active pattern 212a and a second active pattern 212b may be disposed on the buffer layer 211. A gate insulation layer 213 may be disposed on the buffer layer 211 and cover the first active pattern 212a and the second active pattern 212b. A first gate electrode 214a and a second gate electrode 214b may be disposed on the gate insulation layer 213.

An insulation interlayer 215 may be disposed on the gate insulation layer 213 and cover the first gate electrode 214a and the second gate electrode 214b. A first source electrode 216a, a first drain electrode 217a, a second source electrode 216b, and a second drain electrode 217b may be disposed on the insulation interlayer 215. The first source electrode 216a and the first drain electrode 217a may be in contact with the first active pattern 212a through contact holes, and the second source electrode 216b and the second drain electrode 217b may be in contact with the second active pattern 212b through contact holes.

A via insulation layer 218 may be disposed on the insulation interlayer 215 and cover the first transistor T1 and the second transistor T2. The via insulation layer 218 may have a single or a multi-layered structure.

The first pixel electrode 221 may be disposed on the via insulation layer 218. The first pixel electrode 221 may overlap the first transistor T1 and the second transistor T2. The first pixel electrode 221 may be connected to the first drain electrode 217a of the first transistor T1 through a first via hole formed in the via insulation layer 218.

The second pixel electrode 222 may be disposed on the via insulation layer 218 to be adjacent to the first pixel electrode 221. The second pixel electrode 222 may be separated from the first pixel electrode 221. The second pixel electrode 222 may be connected to the second drain electrode 217b of the second transistor T2 through a second via hole formed in the via insulation layer 218.

A pixel defining layer 219 may be disposed on the via insulation layer 218 and cover an edge portion of each of the first pixel electrode 221 and the second pixel electrode 222.

An intermediate layer 223 including a light emitting layer 2232 (see FIG. 11) may be disposed on the first pixel electrode 221, the second pixel electrode 222, and the pixel defining layer 219. Here, the light emitting layer may correspond to an organic light emitting layer. The intermediate layer 223 may include a first intermediate layer 223a overlapping the first emission region PA1, a second intermediate layer 223b overlapping the second emission region PA2, and a third intermediate layer 223c overlapping the transmission region TA.

A common electrode 224 may be disposed on the intermediate layer 223. The common electrode 224 may include a first common electrode 224a overlapping the first emission region PA1, a second common electrode 224b overlapping the second emission region PA2, and a third common electrode 224c overlapping the transmission region TA. The first common electrode 224a may face the first pixel electrode 221 with respect to the first intermediate layer 223a, and the second common electrode 224b may face the second pixel electrode 222 with respect to the second intermediate layer 223b. In an exemplary embodiment, the first common electrode 224a, the second common electrode 224b, and the third common electrode 224c may be electrically connected to each other.

The first pixel electrode 221 and the second pixel electrode 222 may function as an anode. The first common electrode 224a and the second common electrode 224b may function as a cathode. The polarities of the first and second pixel electrodes 221 and 222 and the first and second common electrodes 224a and 224b may be opposite to each other.

The size of the first pixel electrode 221 may correspond to the size of the first emission region PA1, and the size of the second pixel electrode 222 may correspond to the size of the second emission region PA2. A common driving voltage may be applied to the common electrode 224 of each pixel in the organic light emitting portion 20.

In a conventional OLED device, a top surface of the common electrode may be damaged by the encapsulation substrate or the encapsulation film. Further, the common electrode may be damaged from moisture and/or oxygen. To prevent such damage, the OLED device according to an exemplary embodiment may include a capping layer 225.

The capping layer 225 may be disposed on the common electrode 224. The capping layer 225 may include a first capping layer 225a, a second capping layer 225b, and a third capping layer 225c. The first capping layer 225a may overlap the first emission region PA1. The second capping layer 225b may overlap the second emission region PA2. The third capping layer 225c may overlap the transmission region TA.

In an exemplary embodiment, the first pixel electrode 221 may be a reflective electrode that may reflect light, and the first common electrode 224a overlapping the first emission region PA1 may be a transmission electrode that may transmit light. Thus, the first emission region PA1 may be a top emission region, in which light may be emitted towards the first common electrode 224a. In this manner, the amount of light disappeared at a bottom surface of the OLED device 1 may be decreased, because light emitted from a first organic light emitting layer 2232a of the first intermediate layer 223a is released towards a top surface of the OLED device 1.

In an exemplary embodiment, the second pixel electrode 222 may be a transmission electrode that may transmit light, and the second common electrode 224b overlapping the second emission region PA2 may be a transmission electrode that may transmit light. Thus, the second emission region PA2 may be a dual (a top and bottom) emission region, in which light may be emitted towards the second common electrode 224b and the second pixel electrode 222. Since light emitted from a second organic light emitting layer 2232b of the second intermediate layer 223b is released to both top and bottom surfaces of the OLED device 1, a user may watch an image displayed from the OLED device 1 from both sides of the OLED device 1. Further, when light is not emitted from the second intermediate layer 223b, the user may observe an object disposed on an opposite side of the OLED device 1 through the second emission region PA2, since the second emission region PA2 may transmit external light.

In an exemplary embodiment, the third common electrode 224c overlapping the transmission region TA may be a transmission electrode that may transmit light, and a light emitting layer may not disposed in the third intermediate layer 223c. Thus, light may not be emitted from the transmission region TA, and the user may observe an object disposed on an opposite side of the OLED device 1 through the transmission region TA.

FIGS. 7, 8, 9, and 10 are cross-sectional views illustrating a common electrode and a capping layer in FIG. 6.

Referring to FIGS. 7, 8, 9, and 10, the common electrode 224 may include the first common electrode 224a overlapping the first emission region PA1, the second common electrode 224b overlapping the second emission region PA2, and the third common electrode 224c overlapping the transmission region TA. The capping layer 225 may include the first capping layer 225a overlapping the first emission region PA1, the second capping layer 225b overlapping the second emission region PA2, and the third capping layer 225c overlapping the transmission region TA. The capping layer 225 may be disposed on the common electrode 224.

In exemplary embodiments, at least two of the first capping layer 225a, the second capping layer 225b, and the third capping layer 225c may have different thicknesses from each other. Depending on the thicknesses of the first capping layer 225a, the second capping layer 225b, and the third capping layer 225c, light efficiencies of the first emission region PA1 and the second emission region PA2, and light transmittances of the second emission region PA2 and the transmission region TA may be varied.

Figure 7:
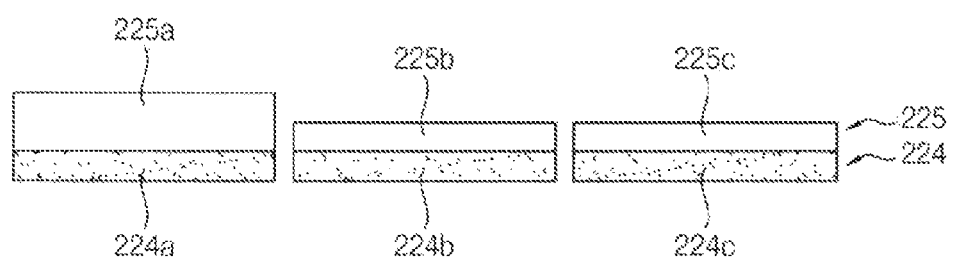
FIG. 7, FIG. 8, FIG. 9, and FIG. 10 are cross-sectional views illustrating a common electrode and a capping layer of FIG. 6.

As illustrated in FIG. 7, according an exemplary embodiment, a thickness of the second capping layer 225b may be substantially the same as a thickness of the third capping layer 225c, and the thickness of the second capping layer 225b may be different from a thickness of the first capping layer 225a. Here, the second capping layer 225b and the third capping layer 225c may be substantially simultaneously formed.

In an exemplary embodiment, the thickness of the second capping layer 225b may be less than the thickness of the first capping layer 225a. In other words, the thicknesses of the second capping layer 225b and the third capping layer 225c may be less than the thickness of the first capping layer 225a. For example, the thicknesses of the second capping layer 225b and the third capping layer 225c may be in a range of about 400 angstrom (Å) to about 450 Å. Since the thicknesses of the second capping layer 225b and the third capping layer 225c are less than the thickness of the first capping layer 225a, light transmittances of the second emission region PA2 and the transmission region TA may be increased, and light transmittance of the OLED device 1 may be improved.

Figure 8:
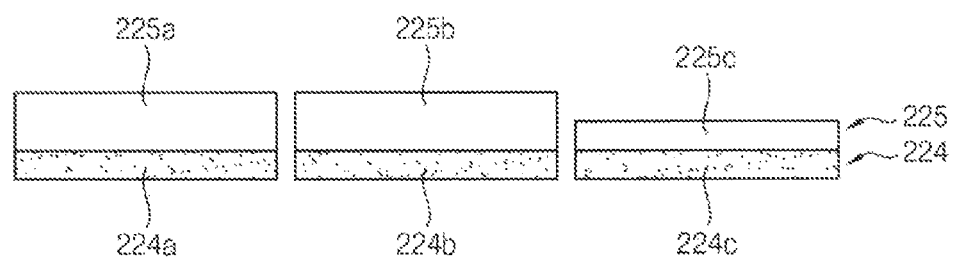

As illustrated in FIG. 8, according to an exemplary embodiment, a thickness of the second capping layer 225b may be substantially the same as a thickness of the first capping layer 225a, and the thickness of the second capping layer 225b may be different from a thickness of the third capping layer 225c. Here, the second capping layer 225b and the first capping layer 225a may be substantially simultaneously formed.

In an exemplary embodiment, the thickness of the second capping layer 225b may be greater than the thickness of the third capping layer 225c. In other words, the thicknesses of the second capping layer 225b and the first capping layer 225a may be greater than the thickness of the third capping layer 225c. For example, the thicknesses of the second capping layer 225b and the first capping layer 225a may each be in a range of about 800 Å to about 850 Å. Since the thicknesses of the second capping layer 225b and the first capping layer 225a are greater than the thickness of the third capping layer 225c, light efficiencies of the second emission region PA2 and the first emission region PA1 may be increased, and image quality of the OLED device 1 may be improved.

In an exemplary embodiment, the thicknesses of each of the first capping layer 225a, the second capping layer 225b, and the third capping layer 225c may be different from each other. In this case, the thicknesses of the first capping layer 225a, the second capping layer 225b, and the third capping layer 225c may be adjusted to increase light efficiencies of the first emission region PA1 and the second emission region PA2, and to increase light transmittances of the second emission region PA2 and the transmission region TA. Thus, light transmittance and image quality of the OLED device 1 may be improved.

In exemplary embodiments, at least two of the first common electrode 224a, the second common electrode 224b, and the third common electrode 224c may have different thicknesses from each other. Depending on the thicknesses of the first common electrode 224a, the second common electrode 224b, and the third common electrode 224c, light efficiencies of the first emission region PA1 and the second emission region PA2 and light transmittances of the second emission region PA2 and the transmission region TA may be varied.

Figure 9:
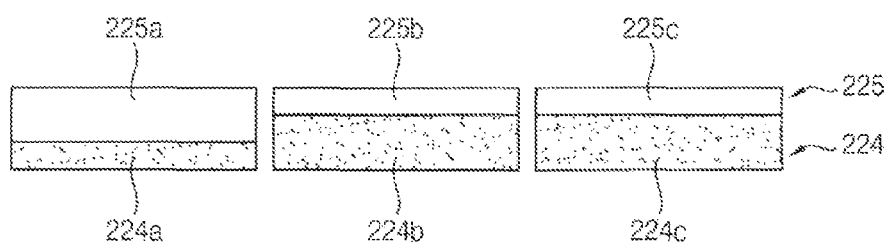

As illustrated in FIG. 9, according to an exemplary embodiment, a thickness of the third common electrode 224c may be substantially the same as a thickness of the second common electrode 224b, and the thickness of the third common electrode 224c may be different from a thickness of the first common electrode 224a. Here, the third common electrode 224c and the second common electrode 224b may be substantially simultaneously formed, which may simplify the manufacturing process of the common electrode 224.

In an exemplary embodiment, the thickness of the third common electrode 224c may be greater than the thickness of the first common electrode 224a. In other words, the thicknesses of the third common electrode 224c and the second common electrode 224b may be greater than the thickness of the first common electrode 224a. Since the thicknesses of the second common electrode 224b is greater than the thickness of the first common electrode 224a, light efficiency of the second emission region PA2 may be increased, and image quality of the OLED device 1 may be improved.

Figure 10:
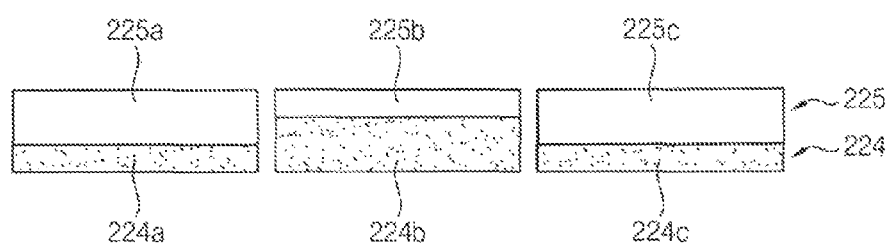

As illustrated in FIG. 10, in an exemplary embodiment, a thickness of the third common electrode 224c may be substantially the same as a thickness of the first common electrode 224a, and the thickness of the third common electrode 224c may be different from a thickness of the second common electrode 224b. Here, the third common electrode 224c and the first common electrode 224a may be substantially simultaneously formed, which may simplify the manufacturing process of the common electrode 224.

In an exemplary embodiment, the thickness of the third common electrode 224c may be less than the thickness of the second common electrode 224b. In other words, the thicknesses of the third common electrode 224c and the first common electrode 224a may be less than the thickness of the second common electrode 224b. Since the thickness of the third common electrode 224c is less than the thickness of the second common electrode 224b, light transmittance of the transmission region TA may be increased, and light transmittance of the OLED device 1 may be improved.

In an exemplary embodiment, thicknesses of the first common electrode 224a, the second common electrode 224b, and the third common electrode 224c may be different from each other. In this case, the thicknesses of the first common electrode 224a, the second common electrode 224b, and the third common electrode 224c may be adjusted to increase light efficiencies of the first emission region PA1 and the second emission region PA2 and to increase light transmittances of the second emission region PA2 and the transmission region TA. Thus, light transmittance and image quality of the OLED device 1 may be improved.

In FIGS. 9 and 10, although the overall thickness of the common electrode 224 and the capping layer 225 in each of the first emission region PA1, the second emission region PA2, and the transmission region TA are illustrated as being substantially similar to each other, however, according to an exemplary embodiment, the overall thickness of the common electrode 224 and the capping layer 225 in each of the first emission region PA1, the second emission region PA2, and the transmission region TA may be varied. For example, in FIG. 10, the thicknesses of the first capping layer 225*a*, the second capping layer 225*b*, and the third capping layer 225*c* may be substantially the same with each other, or at least one thereof may have a different thickness from the others, when at least the two of the first common electrode 224*a*, the second common electrode 224*b*, and the third common electrode 224*c* have different thicknesses from each other.

Figure 11:
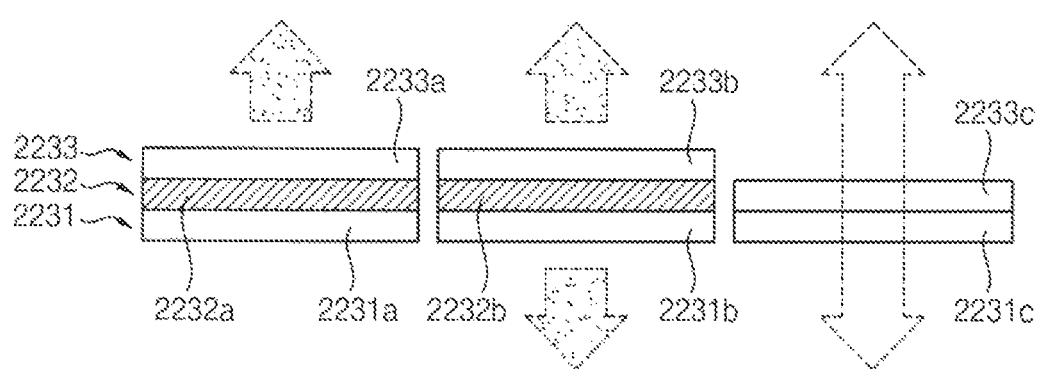
FIG. 11 is a cross-sectional view illustrating an intermediate layer of FIG. 6.

FIG. 11 is a cross-sectional view illustrating an intermediate layer in FIG. 6.

Referring to FIG. 11, the intermediate layer 223 may include a hole injection layer (HIL) 2231, the organic light emitting layer 2232 disposed on the HIL 2231, and an electron transport layer (ETL) 2233 disposed on the organic light emitting layer 2232. In an exemplary embodiment, the intermediate layer 223 may further include a hole transport layer (HTL, not illustrated) disposed between the HIL 2231 and the organic light emitting layer 2232, and an electron injection layer (EIL, not illustrated) disposed on the ETL 2233.

The organic light emitting layer 2232 may include the first organic light emitting layer 2232*a* overlapping the first emission region PA1, and the second organic light emitting layer 2232*b* overlapping the second emission region PA2. In an exemplary embodiment, when the first organic light emitting layer 2232*a* and the second organic light emitting layer 2232*b* emit light having substantially the same color, the first organic light emitting layer 2232*a* and the second organic light emitting layer 2232*b* of each pixel may be formed integrally (or simultaneously), which may reduce the manufacturing time and costs. In an exemplary embodiment, the organic light emitting layer 2232 may be independently formed in each pixel.

The HIL 2231 may include a first HIL 2231*a* overlapping the first emission region PA1, a second HIL 2231*b* overlapping the second emission region PA2, and a third HIL 2231*c* overlapping the transmission region TA. In an exemplary embodiment, the first HIL 2231*a*, the second HIL 2231*b*, and the third HIL 2231*c* may be integrally formed, which may reduce the manufacturing time and costs.

The ETL 2233 may include a first ETL 2233*a* overlapping the first emission region PA1, a second ETL 2233*b* overlapping the second emission region PA2, and a third ETL 2233*c* overlapping the transmission region TA. In an exemplary embodiment, the first ETL 2233*a*, the second ETL 2233*b*, and the third ETL 2233*c* may be formed integrally, which may reduce the manufacturing time and costs.

FIGS. 12, 13, 14, 15, and 16 are cross-sectional views illustrating a method of manufacturing an OLED device according to an exemplary embodiment.

Figure 12:
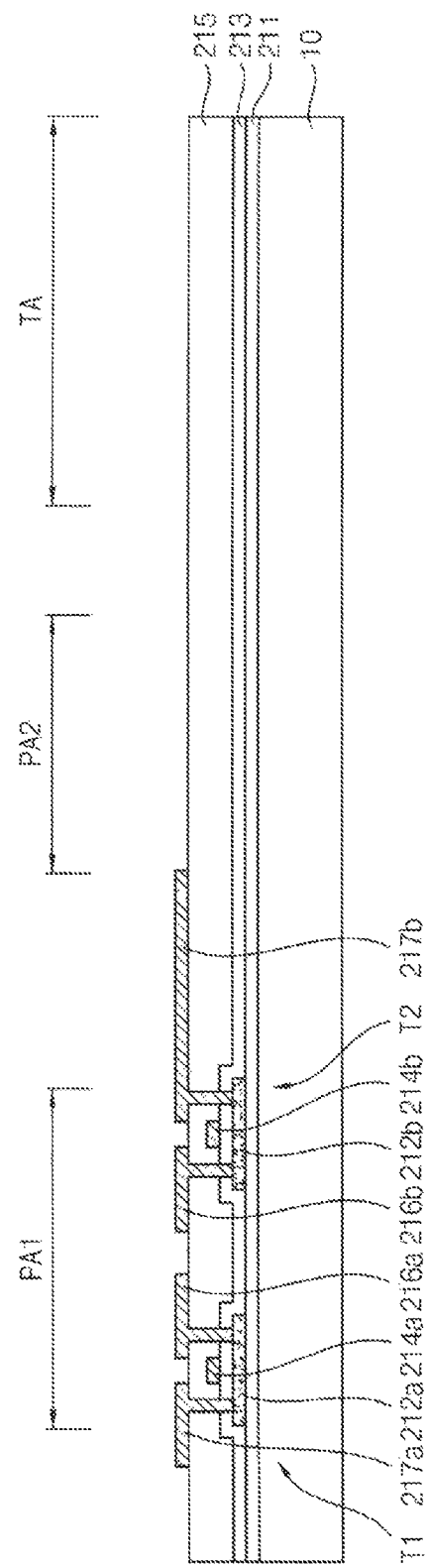
FIG. 12, FIG. 13, FIG. 14, FIG. 15, and FIG. 16 are cross-sectional views illustrating a method of manufacturing an OLED device according to an exemplary embodiment.

Referring to FIG. 12, the buffer layer 211 may be formed on the substrate 10. For example, the buffer layer 211 may include an inorganic material, such as silicon oxide, silicon nitride, silicon oxynitride, aluminum oxide, aluminum nitride, titanium oxide, titanium nitride, or an organic material, such as polyimide, polyester, or acryl.

A semiconductor layer may be formed on the buffer layer 211. The semiconductor layer may be patterned to form the first active pattern 212*a* and the second active pattern 212*b*. For example, the semiconductor layer may include polycrystalline silicon or an oxide semiconductor.

The gate insulation layer 213 may be formed on the buffer layer 211 and cover the first and the second active patterns 212*a* and 212*b*. For example, the gate insulation layer 213 may include silicon oxide, silicon nitride, silicon oxynitride, aluminum oxide, aluminum nitride, titanium oxide, titanium nitride, or the like. Then, a first conductive layer may be formed on the gate insulation layer 213, and the first conductive layer may be patterned to form the first gate electrode 214*a* and the second gate electrode 214*b*. For example, the first conductive layer may include a metal, an alloy thereof, a nitride thereof, or the like.

The insulation interlayer 215 may be formed on the gate insulation layer 213 and cover the first and the second gate electrodes 214*a* and 214*b*. The contact holes may be formed therein to expose portions of the first active pattern 212*a* and portions of the second active pattern 212*b*. For example, the insulation interlayer 215 may include silicon oxide, silicon nitride, silicon oxynitride, aluminum oxide, aluminum nitride, titanium oxide, titanium nitride, or the like. Then, a second conductive layer may be formed on the insulation interlayer 215 to fill the contact holes, and the second conductive layer may be patterned to form the first source electrode 216*a*, the first drain electrode 217*a*, the second source electrode 216*b*, and the second drain electrode 217*b*. For example, the second conductive layer may include a metal, an alloy thereof, a nitride thereof, or the like.

Figure 13:
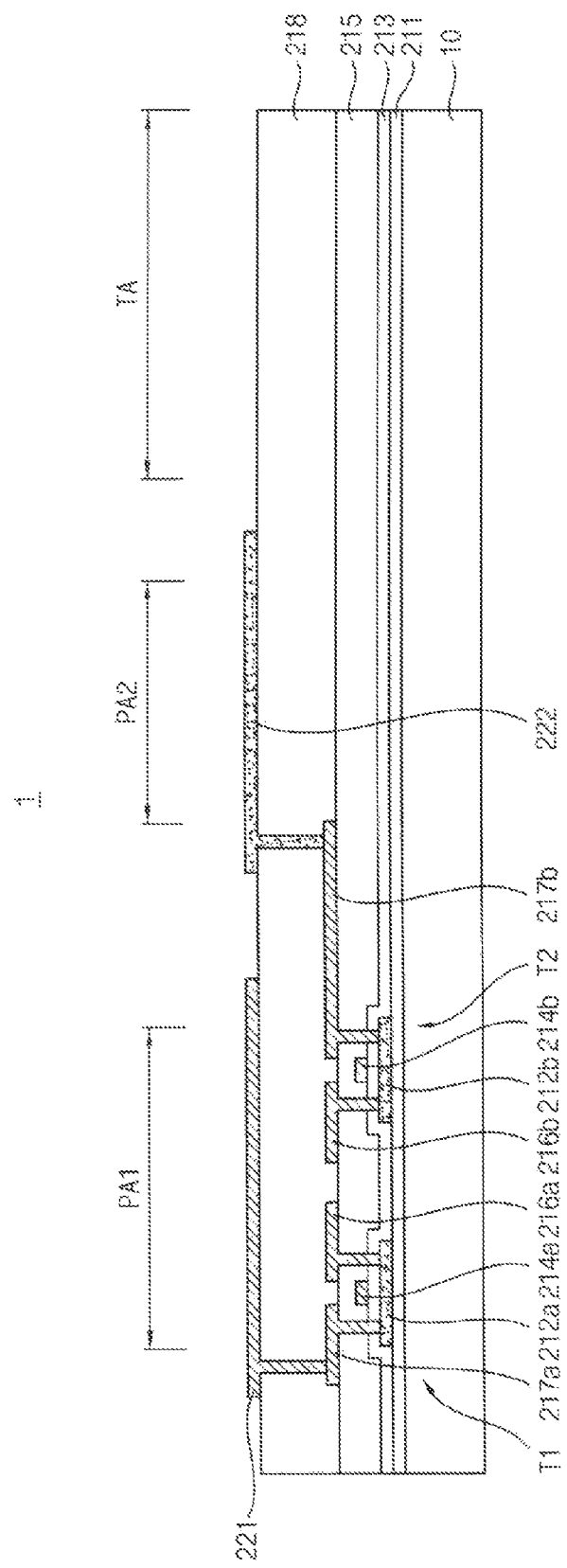

Referring to FIG. 13, the via insulation layer 218 may be formed on the insulation interlayer 215 and cover the first source electrode 216*a*, the first drain electrode 217*a*, the second source electrode 216*b*, and the second drain electrode 217*b*. The first and second via holes may be formed to expose a portion of the first drain electrode 217*a* and a portion of the second drain electrode 217*b*, respectively.

A third conductive layer may be formed on the via insulation layer 218 to fill the first and second via holes. Then, the third conductive layer may be patterned to form the first pixel electrode 221 and the second pixel electrode 222. In an exemplary embodiment, the third conductive layer may include a first transparent conductive layer, a reflective layer, and a second transparent conductive layer. For example, the first transparent conductive layer and the second transparent conductive layer may include indium tin oxide (ITO), indium zinc oxide (IZO), zinc oxide (ZnO), indium oxide ($In_2O_3$), or the like, and the reflective layer may include Ag, Mg, Al, Pt, Pd, Au, Ni, Nd, Ir, Cr, Li, Ca, Yb, a mixture thereof, or the like.

In an exemplary embodiment, the first pixel electrode 221 may include the first transparent conductive layer, the reflective layer, and the second transparent conductive layer, so that the first pixel electrode 221 may function as a reflective electrode. In an exemplary embodiment, the second pixel electrode 222 may include at least one of the first transparent conductive layer and the second transparent conductive layer, so that the second pixel electrode 222 may function as a transmission electrode. Alternatively, the second pixel electrode 222 may include the first transparent conductive layer, the reflective layer, and the second transparent conductive layer, and the second pixel electrode 222 may have a thickness less than that of the first pixel electrode 221, so that the second pixel electrode 222 may function as a transmission electrode.

Figure 14:
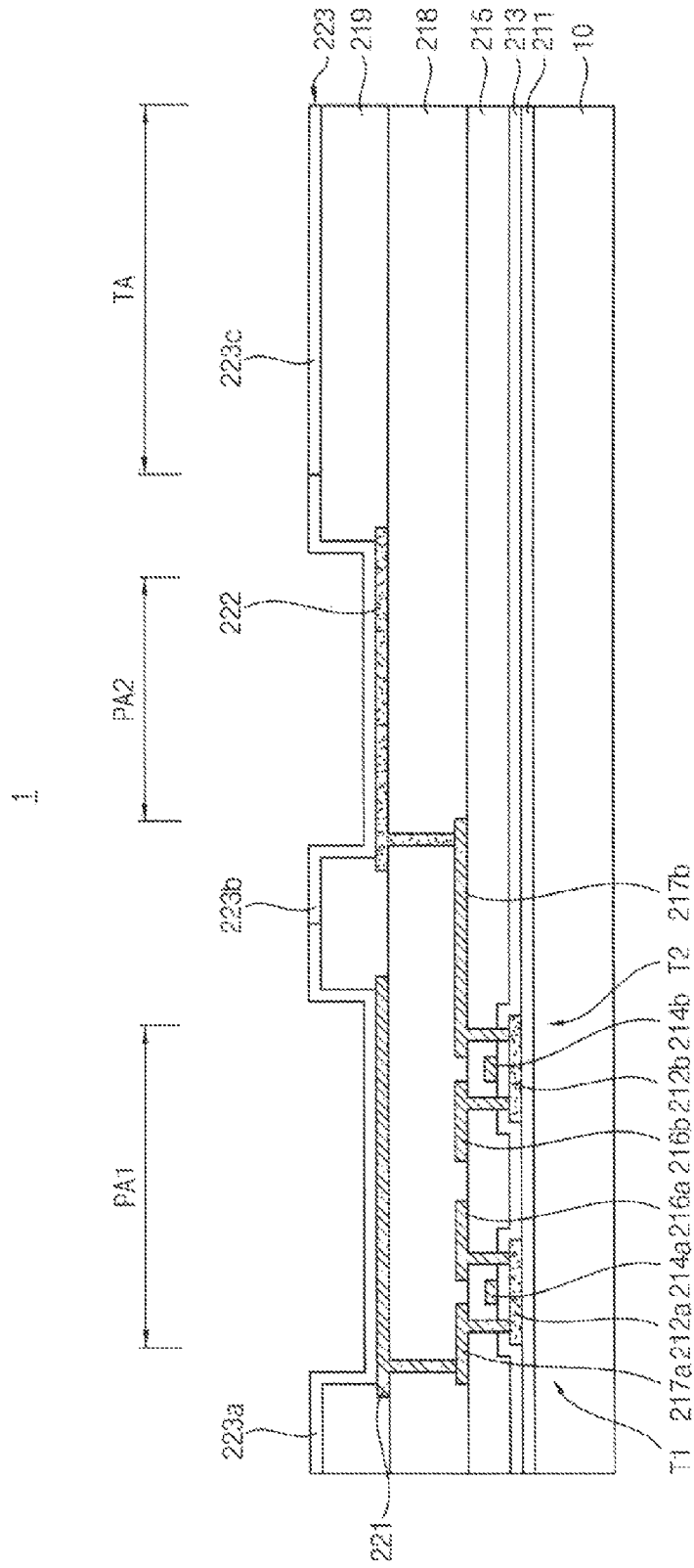

Referring to FIG. 14, the pixel defining layer 219 may be formed on the via insulation layer 218. The pixel defining layer 219 may cover an edge portion of each of the first and second pixel electrodes 221 and 222 and expose a center portion of each of the first and second pixel electrodes 221 and 222. The intermediate layer 223 may be formed on the pixel defining layer 219 and the exposed first and second pixel electrodes 221 and 222.

Referring back to FIG. 11, the intermediate layer 223 may include the HIL 2231, the organic light emitting layer 2232, the ETL 2233, or the like. The HIL 2231 may include the first HIL 2231a overlapping the first emission region PA1, the second HIL 2231b overlapping the second emission region PA2, and the third HIL 2231c overlapping the transmission region TA. The organic light emitting layer 2232 may include the first organic light emitting layer 2232a overlapping the first emission region PA1 and the second organic light emitting layer 2232b overlapping the second emission region PA2. The ETL 2233 may include the first ETL 2233a overlapping the first emission region PA1, the second ETL 2233b overlapping the second emission region PA2, and the third ETL 2233c overlapping the transmission region TA.

In an exemplary embodiment, the first HIL 2231a, the second HIL 2231b, and the third HIL 2231c may be simultaneously formed, which may reduce the manufacturing time and costs.

In an exemplary embodiment, when the first organic light emitting layer 2232a and the second organic light emitting layer 2232b emit substantially the same color, the first organic light emitting layer 2232a and the second organic light emitting layer 2232b may be simultaneously formed, which may reduce the manufacturing time and costs.

In an exemplary embodiment, the first ETL 2233a, the second ETL 2233b, and the third ETL 2233c may be simultaneously formed, which may reduce the manufacturing time and costs.

Figure 15:
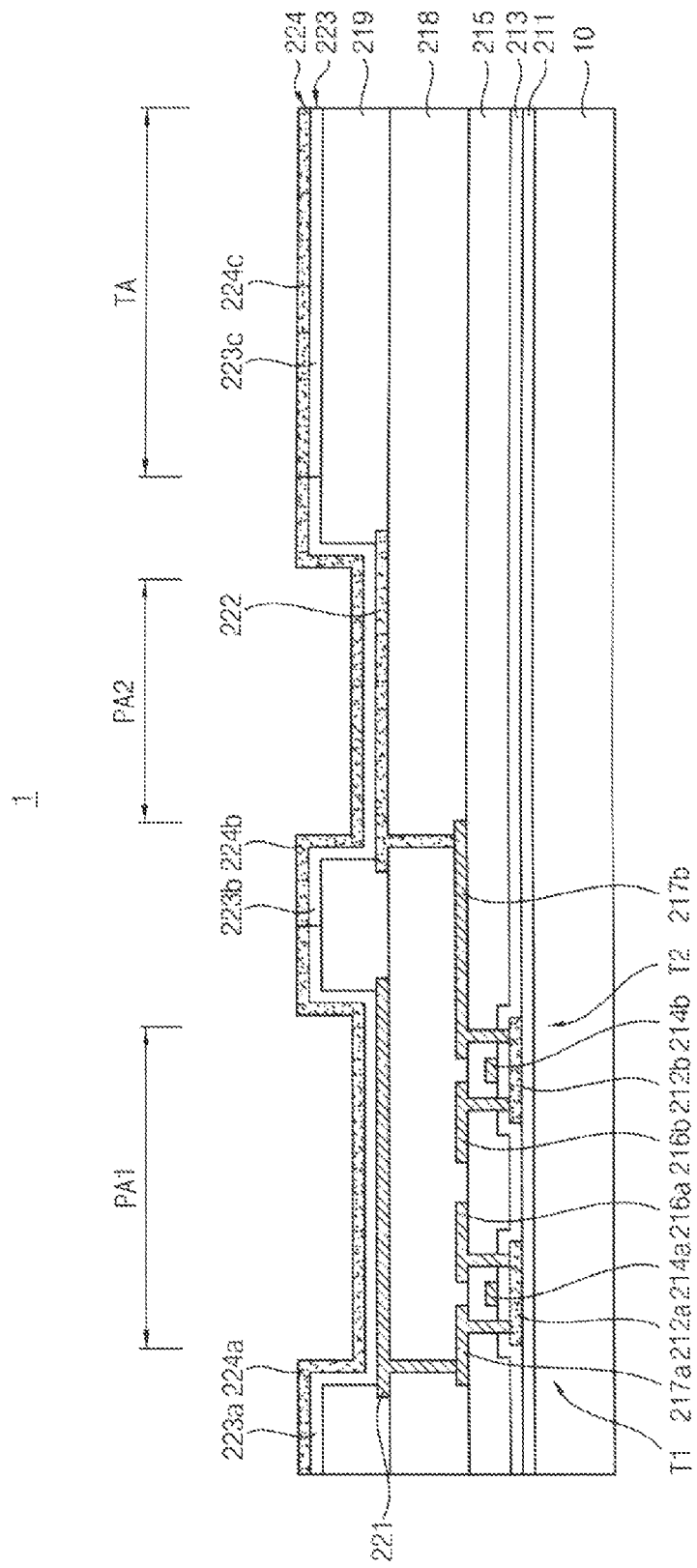

Referring to FIG. 15, the common electrode 224 may be formed on the intermediate layer 223. The common electrode 224 may include the first common electrode 224a overlapping the first emission region PA1, the second common electrode 224b overlapping the second emission region PA2, and the third common electrode 224c overlapping the transmission region TA. For example, the common electrode 224 may include Ag, Mg, Al, Pt, Pd, Au, Ni, Nd, Ir, Cr, Li, Ca, Yb, a mixture thereof, or the like. The common electrode 224 may have a relatively thin thickness, thereby functioning as a transmission electrode.

In an exemplary embodiment, the first common electrode 224a, the second common electrode 224b, and the third common electrode 224c may be individually formed, and at least two of the first common electrode 224a, the second common electrode 224b, and the third common electrode 224c may have different thicknesses from each other. For example, each of the first common electrode 224a, the second common electrode 224b, and the third common electrode 224c may be formed by using a mask. Therefore, light emitting efficiency in the first emission region PA1 and the second emission region PA2 may be improved, and light transmittance in the second emission region PA2 and the transmission region TA may be improved.

Figure 16:
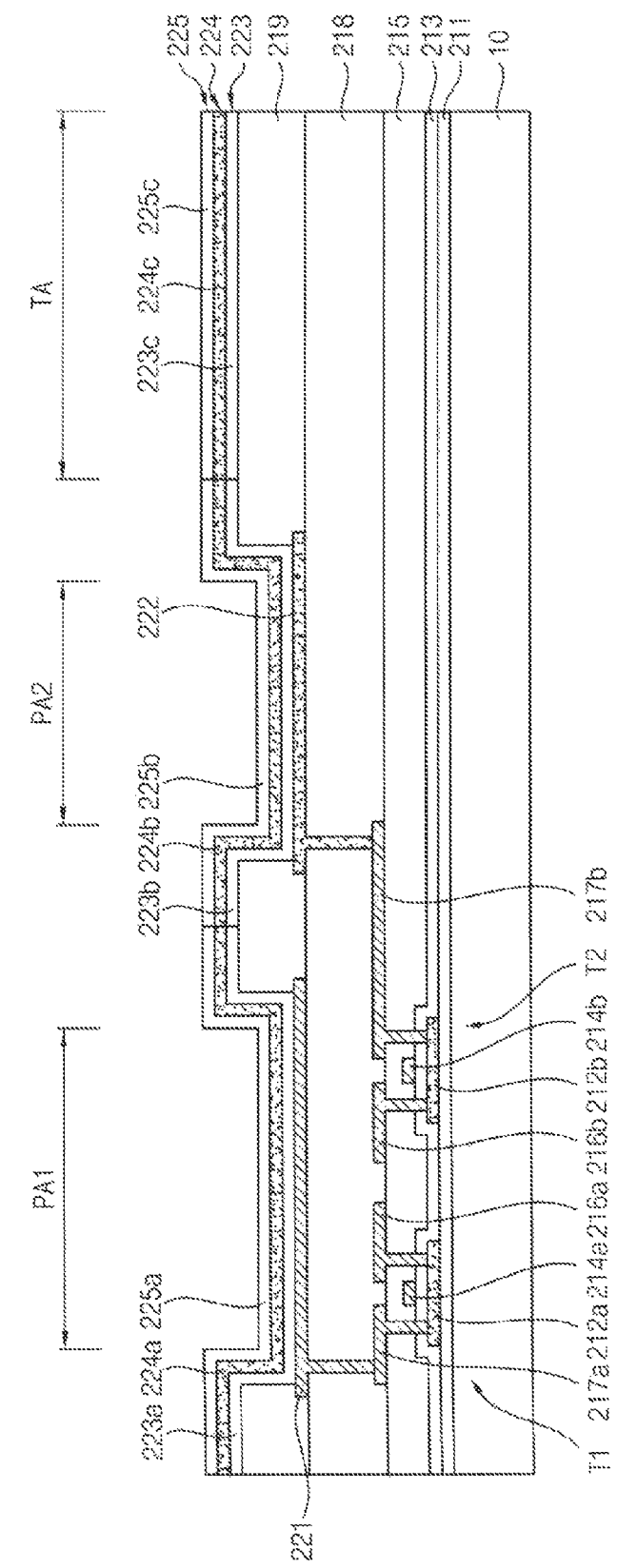

Referring to FIG. 16, the capping layer 225 may be formed on the common electrode 224. The capping layer 225 may include the first capping layer 225a overlapping the first emission region PA1, the second capping layer 225b overlapping the second emission region PA2, and the third capping layer 225c overlapping the transmission region TA. For example, the capping layer 225 may include 8-quinolinato lithium, N,N-diphenyl-N,N-bis(9-phenyl-9H-carbazole-3-yl)biphenyl-4,4'-diamine, N(diphenyl-4-yl)9,9-dimethyl-N-(4(9-phenyl-9H-carbazol-3-yl)phenyl)-9H-fluorene-2-amine, 2-(4-(9,10-di(naphthalene-2-yl)anthracene-2-yl)phenyl)-1-phenyl-1H-benzo-[D]imidazole, or the like.

In an exemplary embodiment, the first capping layer 225a, the second capping layer 225b, and the third capping layer 225c may be individually formed, and at least two of the first capping layer 225a, the second capping layer 225b, and the third capping layer 225c may have different thicknesses from each other. For example, each of the first capping layer 225a, the second capping layer 225b, and the third capping layer 225c may be formed by using a mask. Therefore, light emitting efficiency in the first emission region PA1 and the second emission region PA2 may be improved, and light transmittance in the second emission region PA2 and the transmission region TA may be improved.

The OLED device according to exemplary embodiments may be applied to a display device of a computer, a notebook, a mobile phone, a smartphone, a smart pad, a PMP, a PDA, an MP3 player, or the like.

According to exemplary embodiments of the present invention, an OLED device may include the capping layer and/or the common electrode each having different thicknesses in at least two regions of the first emission region, the second emission region, and the transmission region, so that light emitting efficiency and light transmittance of the OLED device may be improved.

Although certain exemplary embodiments and implementations have been described herein, other embodiments and modifications will be apparent from this description. Accordingly, the inventive concept is not limited to such exemplary embodiments, but rather to the broader scope of the presented claims and various obvious modifications and equivalent arrangements.

What is claimed is:
1. An organic light emitting display (OLED) device, comprising:
a substrate comprising a first emission region, a second emission region, and a transmission region;
a pixel circuit disposed on the substrate;
a first pixel electrode disposed in the first emission region, the first pixel electrode configured to reflect light and electrically connected to the pixel circuit;
a second pixel electrode disposed in the second emission region, the second pixel electrode configured to transmit light and electrically connected to the pixel circuit;
a light emitting layer disposed on the first pixel electrode and the second pixel electrode, the light emitting layer comprising a first light emitting layer overlapping the first emission region and a second light emitting layer overlapping the second emission region;
a common electrode disposed on the light emitting layer, the common electrode configured to transmit light and comprising a first common electrode overlapping the first emission region, a second common electrode overlapping the second emission region, and a third common electrode overlapping the transmission region; and
a capping layer disposed on the common electrode, the capping layer comprising a first capping layer overlapping the first emission region, a second capping layer overlapping the second emission region, and a third capping layer overlapping the transmission region,
wherein at least two of the first capping layer, the second capping layer, and the third capping layer have different thicknesses from each other.

2. The OLED device of claim 1, wherein:
a thickness of the second capping layer is the same as a thickness of the third capping layer; and
the thickness of the second capping layer is different from a thickness of the first capping layer.

3. The OLED device of claim 2, wherein the thickness of the second capping layer is less than the thickness of the first capping layer.

4. The OLED device of claim 1, wherein:
a thickness of the second capping layer is the same as a thickness of the first capping layer; and
the thickness of the second capping layer is different from a thickness of the third capping layer.

5. The OLED device of claim 4, wherein the thickness of the second capping layer is greater than the thickness of the third capping layer.

6. The OLED device of claim 1, wherein the thicknesses of the first capping layer, the second capping layer, and the third capping layer are different from each other.

7. The OLED device of claim 1, wherein at least two of the first common electrode, the second common electrode, and the third common electrode have different thicknesses from each other.

8. The OLED device of claim 7, wherein:
a thickness of the third common electrode is the same as a thickness of the second common electrode; and
the thickness of the third common electrode is different from a thickness of the first common electrode.

9. The OLED device of claim 8, wherein the thickness of the third common electrode is greater than the thickness of the first common electrode.

10. The OLED device of claim 7, wherein:
a thickness of the third common electrode is the same as a thickness of the first common electrode; and
the thickness of the third common electrode is different from a thickness of the second common electrode.

11. The OLED device of claim 10, wherein the thickness of the third common electrode is less than the thickness of the second common electrode.

12. The OLED device of claim 7, wherein the thicknesses of the first common electrode, the second common electrode, and the third common electrode are different from each other.

13. The OLED device of claim 1, wherein the first common electrode, the second common electrode, and the third common electrode are electrically connected to each other.

14. The OLED device of claim 1, wherein the pixel circuit overlaps the first emission region and does not overlap the second emission region.

15. An organic light emitting display (OLED) device, comprising:
a substrate comprising a first emission region, a second emission region, and a transmission region;
a pixel circuit disposed on the substrate;
a first pixel electrode disposed in the first emission region, the first pixel electrode configured to reflect light and electrically connected to the pixel circuit;
a second pixel electrode disposed in the second emission region, the second pixel electrode configured to transmit light and electrically connected to the pixel circuit;
a light emitting layer disposed on the first pixel electrode and the second pixel electrode, the light emitting layer comprising a first light emitting layer overlapping the first emission region and a second light emitting layer overlapping the second emission region;
a common electrode disposed on the light emitting layer, the common electrode configured to transmit light and comprising a first common electrode overlapping the first emission region, a second common electrode overlapping the second emission region, and a third common electrode overlapping the transmission region; and
a capping layer disposed on the common electrode, the capping layer comprising a first capping layer overlapping the first emission region, a second capping layer overlapping the second emission region, and a third capping layer overlapping the transmission region,
wherein at least two of the first common electrode, the second common electrode, and the third common electrode have different thicknesses from each other.

16. The OLED device of claim 15, wherein:
a thickness of the third common electrode is the same as a thickness of the second common electrode; and
the thickness of the third common electrode is different from a thickness of the first common electrode.

17. The OLED device of claim 16, wherein the thickness of the third common electrode is greater than the thickness of the first common electrode.

18. The OLED device of claim 15, wherein:
a thickness of the third common electrode is the same as a thickness of the first common electrode; and
the thickness of the third common electrode is different from a thickness of the second common electrode.

19. The OLED device of claim 18, wherein the thickness of the third common electrode is less than the thickness of the second common electrode.

20. The OLED device of claim 15, wherein the thicknesses of the first common electrode, the second common electrode, and the third common electrode are different from each other.

* * * * *